US012586526B2

(12) United States Patent
Ha et al.

(10) Patent No.: US 12,586,526 B2
(45) Date of Patent: Mar. 24, 2026

(54) DISPLAY DEVICE AND MOBILE ELECTRONIC DEVICE INCLUDING THE SAME

(71) Applicant: Samsung Display Co., LTD., Yongin-si (KR)

(72) Inventors: Jin Joo Ha, Yongin-si (KR); Se Hyun Lee, Yongin-si (KR); Kwi Hyun Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/733,732

(22) Filed: Jun. 4, 2024

(65) Prior Publication Data

US 2025/0029559 A1 Jan. 23, 2025

(30) Foreign Application Priority Data

Jul. 18, 2023 (KR) ........................ 10-2023-0093185

(51) Int. Cl.
*G09G 3/3233* (2016.01)
*G09G 3/32* (2016.01)
*H10K 59/121* (2023.01)

(52) U.S. Cl.
CPC ............. *G09G 3/3233* (2013.01); *G09G 3/32* (2013.01); *H10K 59/1213* (2023.02)

(58) Field of Classification Search
CPC .... G09G 3/32; G09G 3/3233; H10K 59/1213; H10K 59/131
See application file for complete search history.

(56) References Cited

U.S. PATENT DOCUMENTS

2013/0050067 A1* 2/2013 Yamashita ........... G09G 3/3233
345/76
2024/0268150 A1* 8/2024 Kusukawa ......... H10K 59/1216

FOREIGN PATENT DOCUMENTS

CN 205159323 U * 4/2016 ....... H01L 27/14603
KR 1020190016857 A 2/2019
KR 102297000 B1 9/2021

* cited by examiner

*Primary Examiner* — Stacy Khoo
(74) *Attorney, Agent, or Firm* — CANTOR COLBURN LLP

(57) ABSTRACT

A display device and a mobile electronic device including the display device each include a substrate, a driving element layer on the substrate and including pixel driving circuits for driving pixels, and a light emitting element layer on the driving element layer and including a light emitting element of each pixel. Transistors included in each pixel driving circuit are divided into a first transistor group and a second transistor group connected to a first well region and a second well region of the substrate, respectively, the first and second well regions in each pixel are spaced apart from each other by a first interval, the pixels include a first pixel and a second pixel adjacent to each other in a first direction, and well regions adjacent to each other in the first pixel and the second pixel are spaced apart from each other by the first interval.

20 Claims, 16 Drawing Sheets

PC T1, T2, T3, T4, C1
GL . GWL, GIL
TG1 · T1
TG2 T2, T3, T4

DISPLAY DEVICE AND MOBILE ELECTRONIC DEVICE INCLUDING THE SAME

This application claims priority to Korean Patent Application No. 10-2023-0093185, filed on Jul. 18, 2023, and all the benefits accruing therefrom under 35 U.S.C. 119, the content of which in its entirety is herein incorporated by reference.

BACKGROUND

1. Field

The disclosure relates to a display device and a mobile electronic device including the display device.

2. Description of the Related Art

A wearable device that is developed in the form of glasses or a helmet and focuses on a distance close to the user's eyes is being developed. For example, the wearable device may be a head mounted display (HMD) device or augmented reality (AR) glass. Such a wearable device provides a user with an AR screen or a virtual reality (VR) screen.

The wearable device such as the HMD device or the AR glass may be desired to have a display specification of at least 2000 pixels per inch (PPI) to allow the user to use the device for a long time without feeling dizzy. Accordingly, organic light emitting diode on silicon (OLEDoS) technology, which is a small organic light emitting display device with high resolution, may be used to realize the wearable device. The OLEDoS is a technology that disposes organic light emitting diodes (OLEDs) on a semiconductor wafer substrate on which a complementary metal oxide semiconductor (CMOS) is disposed.

SUMMARY

Embodiments of the disclosure provide a display device capable of increasing the degree of integration of pixels and providing an ultra-high resolution display panel by reducing a separation distance between transistors forming a pixel driving circuit, and a mobile electronic device including the same.

According to an embodiment of the disclosure, a display device includes a substrate, a driving element layer disposed on the substrate and including a plurality of pixel driving circuits for driving a plurality of pixels, and a light emitting element layer disposed on the driving element layer and including a light emitting element of each of the plurality of pixel. In such an embodiment, transistors included in each of the plurality of pixel driving circuits are divided into a first transistor group connected to a first well region of the substrate and a second transistor group connected to a second well region of the substrate, the first well region and the second well region are disposed to be spaced apart from each other by a first interval, the plurality of pixels include a first pixel and a second pixel disposed to be adjacent to each other in a first direction, and well regions adjacent to each other in the first pixel and the second pixel are disposed to be spaced apart from each other by the first interval.

In an embodiment, a first body voltage may be input to the first well region as a body bias voltage of the first transistor group, and a second body voltage may be input to the second well region as a body bias voltage of the second transistor group.

In an embodiment, the first well region and the second well region in each of the plurality of pixels may be disposed to be spaced apart from each other by the first interval in a first direction.

In an embodiment, a first well region included in the first pixel may be disposed to be spaced apart from a first well region or a second well region included in the second pixel by the first interval in the first direction.

In an embodiment, the plurality of pixels may further include a third pixel disposed to be adjacent to the first pixel in a second direction perpendicular to the first direction, and the first well region included in the first pixel may be disposed to be spaced apart from a first well region or a second well region included in the third pixel by a second interval greater than the first interval in the second direction.

In an embodiment, the plurality of pixels may further include a third pixel disposed to be adjacent to the first pixel in a second direction perpendicular to the first direction, and the first well region included in the first pixel may be disposed to be spaced apart from a first well region or a second well region included in the third pixel by the first interval in the second direction.

In an embodiment, the first direction may be a short side direction of the display device, and the second direction may be a long side direction of the display device.

In an embodiment, the first direction may be a long side direction of the display device, and the second direction may be a short side direction of the display device.

In an embodiment, the first transistor group may include a driving transistor which supplies a driving current to the light emitting element, and the second transistor group includes at least one switching transistor which controls a voltage of a node included in the pixel driving circuit.

In an embodiment, the transistors included in each of the plurality of pixel driving circuits may be P-type metal oxide semiconductor field effect transistors (MOSFETs) or N-type MOSFETs.

According to an embodiment of the disclosure, a mobile electronic device includes a display device including a display panel in which a light emitting element is disposed on a substrate. In such an embodiment, the display panel includes a driving element layer disposed on the substrate and including a plurality of pixel driving circuits for driving a plurality of pixels, and a light emitting element layer disposed on the driving element layer and including the light emitting element of each of the plurality of pixels, where transistors included in each of the plurality of pixel driving circuits are divided into a first transistor group connected to a first well region of the substrate and a second transistor group connected to a second well region of the substrate, the first well region and the second well region in each of the plurality of pixels are disposed to be spaced apart from each other by a first interval, the plurality of pixels include a first pixel and a second pixel disposed to be adjacent to each other in a first direction, and well regions adjacent to each other in the first pixel and the second pixel are disposed to be spaced apart from each other by the first interval.

In an embodiment, a first body voltage may be input to the first well region as a body bias voltage of the first transistor group, and a second body voltage may be input to the second well region as a body bias voltage of the second transistor group.

In an embodiment, the first well region and the second well region in each of the plurality of pixels may be disposed to be spaced apart from each other by the first interval in a first direction.

In an embodiment, a first well region included in the first pixel may be disposed to be spaced apart from a first well region or a second well region included in the second pixel by the first interval in the first direction.

In an embodiment, the plurality of pixels may further include a third pixel disposed to be adjacent to the first pixel in a second direction perpendicular to the first direction, and the first well region included in the first pixel may be disposed to be spaced apart from a first well region or a second well region included in the third pixel by a second interval greater than the first interval in the second direction.

In an embodiment, the plurality of pixels may further include a third pixel disposed to be adjacent to the first pixel in a second direction perpendicular to the first direction, and the first well region included in the first pixel may be disposed to be spaced apart from a first well region or a second well region included in the third pixel by the first interval in the second direction.

In an embodiment, the first direction may be a short side direction of the display device, and the second direction may be a long side direction of the display device.

In an embodiment, the first direction may be a long side direction of the display device, and the second direction may be a short side direction of the display device.

In an embodiment, the first transistor group may include a driving transistor which supplies a driving current to the light emitting element, and the second transistor group includes at least one switching transistor which controls a voltage of a node included in the pixel driving circuit.

In an embodiment, the transistors included in each of the plurality of pixel driving circuits may be P-type MOSFETs or N-type MOSFETs.

According to embodiments of the display device and the mobile electronic device including the display device, by reducing the separation distance between the transistors of the pixel driving circuit, the degree of integration of pixels may be increased and the ultra-high resolution display panel may be provided.

However, embodiments of the disclosure are not restricted to those set forth herein. The above and other features of embodiments of the disclosure will become more apparent to one of ordinary skill in the art to which the present disclosure pertains by referencing the detailed description below.

BRIEF DESCRIPTION OF THE DRAWINGS

The above and other features of embodiments of the disclosure will become more apparent by describing in detail embodiments thereof with reference to the attached drawings, in which:

FIG. 5 is a view schematically illustrating a cross-section of a portion of the display panel of the display device according to an embodiment;

DETAILED DESCRIPTION

Figure 1:
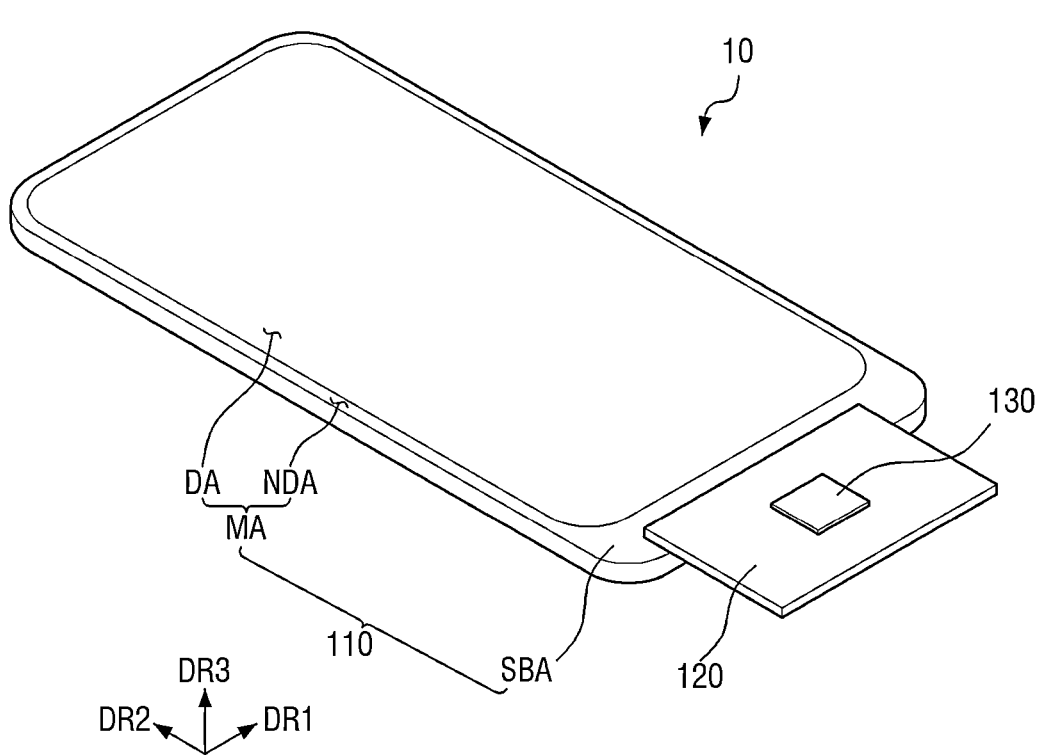
FIG. 1 is a perspective view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

FIG. 1 is a perspective view illustrating a display device according to an embodiment.

Referring to FIG. 1, an embodiment of a display device 10 may be applied to portable electronic devices such as a mobile phone, a smartphone, a tablet personal computer (PC), a mobile communication terminal, an electronic notebook, an electronic book, a portable multimedia player (PMP), navigation, and an ultra mobile PC (UMPC). In an embodiment, for example, the display device 10 may be applied to a display unit of a television, a laptop computer, a monitor, a billboard, or the Internet of Things (IOT) device. In an embodiment, for example, the display device 10 may be applied to a wearable device such as a smart watch, a watch phone, a glasses-type display, and a head mounted display (HMD).

The display device 10 may be formed in a planar shape similar to a quadrangle. In an embodiment, for example, the display device 10 may have a planar shape similar to a quadrangle having a short side in a first direction DR1 and a long side in a second direction DR2. Alternatively, the display device 10 may have a planar shape similar to a quadrangle having a long side in a first direction DR1 and a short side in a second direction DR2 crossing the first direction DR1. In FIG. 1, a third direction DR3 indicates a normal direction perpendicular to a plane defined by the first direction DR1 and the second direction DR2. The third direction DR3 may be a thickness direction of the display device 10. A corner where the short side and the long side meet may be formed to be rounded to have a predetermined curvature or formed at a right angle. In embodiments, the planar shape of the display device 10 is not limited to the quadrangle, and may be formed similarly to other polygons, circles, or ovals.

In an embodiment, the display device 10 includes a display panel 110, a circuit board 120, and a power supply unit 130.

The display panel 110 is a display panel 110 including a semiconductor wafer substrate (200 in FIG. 2) as a base substrate. The display panel 110 may include a main area MA and a sub-area SBA.

The main area MA may include a display area DA including pixels (PX in FIG. 3) for displaying an image, and a non-display area NDA disposed around the display area DA.

The non-display area NDA may refer to an area other than the display area DA. The display area DA may emit light from a plurality of light emitting areas or a plurality of opening areas. In an embodiment, for example, the display panel 110 may include a pixel driving circuit (PC in FIG. 4) including switching elements, a pixel defining film defining a light emitting area or an opening area, and a light emitting element (LEL in FIG. 5) that is a self-light emitting element.

The light emitting element LEL may include at least one selected from an organic light emitting diode (LED) including an organic light emitting layer, a quantum dot LED including a quantum dot light emitting layer, an inorganic LED including an inorganic semiconductor, and a micro LED, but is not limited thereto.

The non-display area NDA may be an area outside the display area DA. The non-display area NDA may be defined as an edge area of the main area MA of the display panel 110. The non-display area NDA may include fan-out lines (not illustrated) extending from lines (e.g., a gate line, a data line, and an emission control line) of the display area DA and a display pad portion (not illustrated).

The sub-area SBA may extend from one side of the main area MA. The sub-area SBA may include a main pad portion connected to the circuit board 120. Optionally, the sub-area SBA may be omitted, and the main pad portion may be disposed in the non-display area NDA.

The circuit board 120 may be attached onto the main pad portion of the display panel 110 using an anisotropic conductive film (ACF). Lead lines of the circuit board 120 may be electrically connected to the main pad portion of the display panel 110. The circuit board 120 may be a flexible printed circuit board, a printed circuit board, or a flexible film such as a chip on film.

The power supply unit 130 may be disposed on the circuit board 120, and may supply a power voltage to the display driving circuit (210 in FIG. 2) and the display panel 110. The power supply unit 130 may generate a driving voltage and supply the driving voltage to a driving voltage line. In an embodiment, for example, the driving voltage may include a high-potential voltage (a first driving voltage, ELVDD in FIG. 4), a low-potential voltage (a second driving voltage, ELVSS in FIG. 4), and an initialization voltage (VINT in FIG. 4) for driving the light emitting element LEL.

Figure 2:
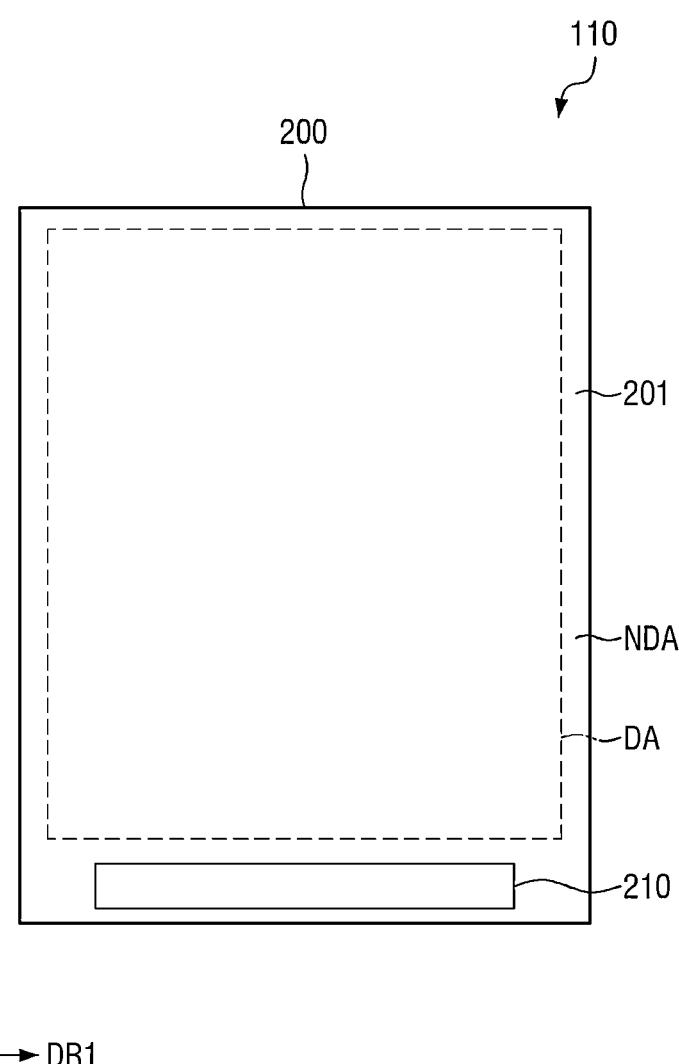
FIG. 2 is a plan view illustrating a display panel according to an embodiment.

FIG. 2 is a plan view illustrating a display panel according to an embodiment.

Referring to FIG. 2, an embodiment of the display panel 110 may be an organic light emitting diode on silicon (OLEDoS) panel including the semiconductor wafer substrate 200 as a base substrate. In an embodiment, for example, the display panel 110 may include the semiconductor wafer substrate 200, and the pixel driving circuit (PC in FIG. 4) and the display driving circuit 210 for controlling the pixel driving circuit PC may be disposed on a front surface 201 of the semiconductor wafer substrate 200. The pixel driving circuit PC is disposed to overlap the light emitting element (LEL in FIG. 5) of each pixel (PX in FIG. 3) in the display area DA. The display driving circuit 210 is disposed in the non-display area NDA and serves to drive the pixel driving circuits PC. Herein, the semiconductor wafer substrate 200 may be referred to as a "substrate" or a "circuit board".

The pixel driving circuit (PC in FIG. 4) and the display driving circuit 210 may be formed on a metal oxide semiconductor field effect transistor (MOSFET) layer 501 disposed on the front surface 201 of the semiconductor wafer substrate 200. The MOSFET layer 501 may include, for example, an N-type MOSFET and/or a P-type MOSFET. Herein, the MOSFET layer (501 in FIG. 5) may be referred to as a "drive element layer".

Figure 3:
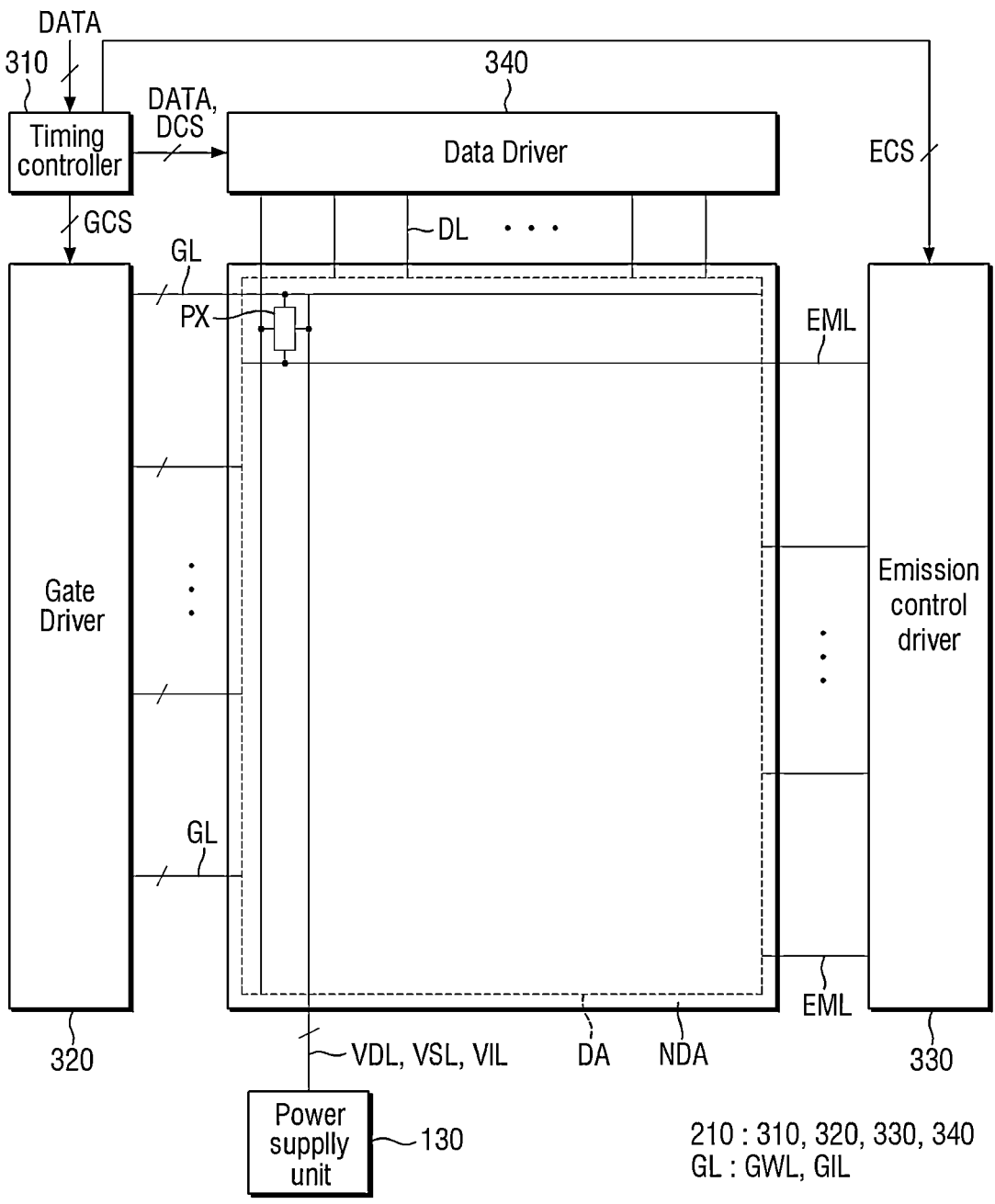
FIG. 3 is a configuration block diagram of the display device according to an embodiment.

FIG. 3 is a configuration block diagram of the display device according to an embodiment.

Referring to FIG. 3, an embodiment of the display device 10 includes a display panel 110 based on the semiconductor wafer substrate 200. The display driving circuit 210 may be embedded in the display panel 110. In an embodiment, the display driving circuit 210 may be formed on the MOSFET layer 501 disposed on the front surface 201 of the semiconductor wafer substrate 200. The display driving circuit 210 may include a timing controller 310, a gate driver 320, an emission control driver 330, and a data driver 340, but the disclosure is not limited thereto. Although not illustrated, the display driving circuit 210 may further include a memory (e.g., a one-time-programmable memory (OTP)), an interface circuit (I/F), an image processing circuit (e.g., logic circuitry), and/or a gamma processing circuit.

The display area DA of the display panel 110 includes a plurality of pixels PX disposed in a matrix form. Each of the plurality of pixels PX may be connected to a first driving voltage line VDL, a second driving voltage line VSL, a gate line GL, an emission control line EML, an initialization line VIL, and a data line DL.

The first driving voltage line VDL supplies the first driving voltage (ELVDD in FIG. 4) input from the power supply unit 130 to the plurality of pixels PX. The second driving voltage line VSL supplies the second driving voltage (ELVSS in FIG. 4) input from the power supply unit 130 to the plurality of pixels PX. The gate line GL supplies gate signals (GI and GW in FIG. 4) input from the gate driver 320 to the plurality of pixels PX. The emission control line EML supplies the emission control signal (EM in FIG. 4) input from the emission control driver 330 to the plurality of pixels PX. The initialization line VIL supplies the initialization voltage (VINT in FIG. 4) input from the power supply unit 130 to the plurality of pixels PX. The data line DL supplies analog data voltages input from the data driver 340 to the pixels PX.

The first driving voltage ELVDD may be a high-potential voltage, and the second driving voltage ELVSS may be a low-potential voltage. In an embodiment, for example, the first driving voltage ELVDD may have a potential higher than that of the second driving voltage ELVSS. The initialization voltage (VINT in FIG. 4) may have a potential for initializing the pixel driving circuit (PC in FIG. 4) for each frame.

One gate line GL illustrated in FIG. 3 may include a first gate line GWL and a second gate line GIL, but the disclosure is not limited thereto.

Each of the plurality of pixels PX includes the light emitting element (LEL in FIG. 4), and may include a plurality of transistors and one or more capacitors as the pixel driving circuit (PC in FIG. 4) for driving the light emitting element LEL.

The timing controller 310 may receive a data signal DATA and timing signals from the circuit board 120. The timing controller 310 may control an operation timing of the data driver 340 by generating a data control signal DCS based on the timing signals. The timing controller 310 may control an operation timing of the gate driver 320 by generating a gate control signal GCS based on the timing signals. The timing controller 310 may control an operation timing of the emission control driver 330 by generating an emission control signal ECS based on the timing signals.

The data driver 340 may convert the data signal DATA into analog data voltages and supply the converted analog data voltages to the pixels PX through the data lines DL. The gate signals of the gate driver 320 may select the pixels PX to which the data voltage is supplied, and the selected pixels PX may receive the data voltage through the data lines DL.

The power supply unit 130 may be disposed on the circuit board 120, and may supply a power voltage to the display driving circuit 210 and the display panel 110. The power supply unit 130 may generate a driving voltage and supply the driving voltage to the first driving voltage line VDL, and may generate a common voltage and supply the common voltage to a common electrode (e.g., a cathode electrode CAE in FIG. 5) common to the light emitting elements LEL of the plurality of pixels PX.

The gate driver 320 may supply the gate signals (GI and GW in FIG. 4) to the pixels PX through the gate lines GL.

The emission control driver 330 may supply the emission signal (EM in FIG. 4) to the pixels PX through the emission control lines EML.

Figure 4:
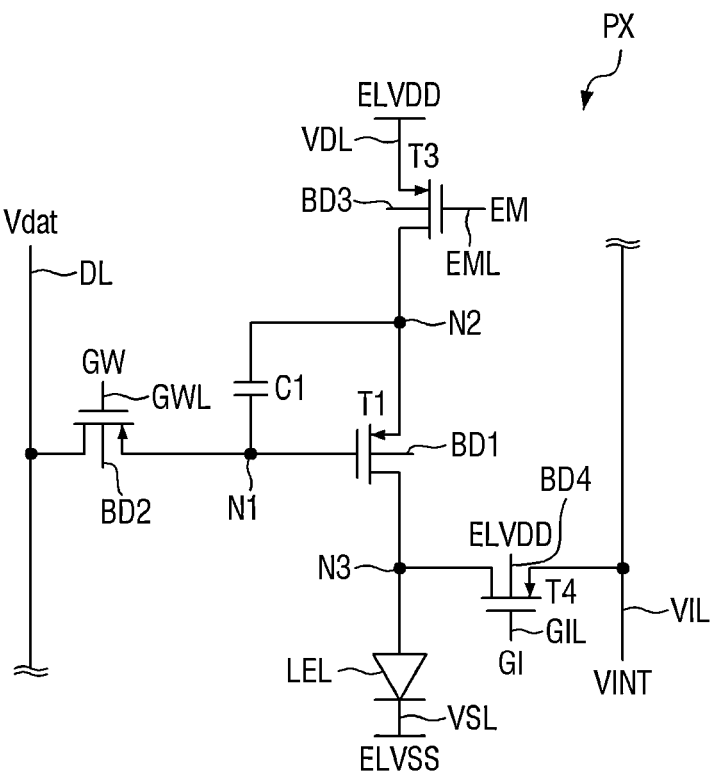
FIG. 4 is a circuit diagram of one pixel of the display device according to an embodiment.

FIG. 4 is a circuit diagram of one pixel of the display device according to an embodiment.

Referring to FIG. 4, in an embodiment, the pixel PX may include the light emitting element LEL (e.g., an organic light emitting diode) as a display element and the pixel driving circuit PC connected to the light emitting element LEL. The pixel driving circuit PC may include first to fourth transistors T1, T2, T3, and T4 and a first capacitor C1, but the disclosure is not limited thereto. The first to fourth transistors T1, T2, T3, and T4 may be implemented as N-type MOSFETs and/or P-type MOSFETs. FIG. 4 illustrates an embodiment where the first to fourth transistors T1, T2, T3, and T4 are P-type MOSFETs, but the disclosure is not limited thereto.

The first transistor T1 may be a driving transistor whose source-drain current is determined based on a gate-source voltage, and each of the second to fourth transistors T2 to T4 may be a switching transistor that is turned on/off based on a gate-source voltage, substantially a gate voltage. Therefore, the transistors T1, T2, T3, and T4 included in the pixel driving circuit PC may include a first transistor group TG1 including the first transistor T1 that is the driving transistor, and a second transistor group TG2 including the second to fourth transistors T2, T3, and T4 that are the switching transistors. That is, the first transistor group TG1 may be a group including the driving transistor, and the second transistor group TG2 may be a group including at least one switching transistor.

A body bias voltage BD1 of the first transistor group TG1 may be designed differently from body bias voltages BD2, BD3, and BD4 of the second transistor group TG2 to optimize a performance of the pixel driving circuit PC. For example, considering that the driving transistor is a transistor for supplying a driving current to the light emitting element LEL (i.e., OLED), an appropriate body bias voltage is desired for the driving transistor. In addition, the switching transistor is desired to receive an appropriate body bias voltage to rapidly control voltages of respective nodes (e.g., N1, N2, and N3) included in the pixel driving circuit PC. To this end, as will be described later with reference to FIG. 6, the first transistor group TG1 is disposed in a first well region (W1 in FIG. 6), and the second transistor group TG2 is disposed in a second well region (W2 in FIG. 6). A first body voltage is input to the first well region W1 as the body bias voltage BD1 of the first transistor group TG1. A second body voltage is input to the second well region W2 as the body bias voltages BD2, BD3, and BD4 of the second transistor group TG2.

The first transistor T1 includes a gate connected to a first node N1, a source connected to a second node N2, and a drain connected to a third node N3. The first transistor T1 is turned on or off based on a voltage level of the first node N1. The turned-on first transistor T1 connects the second node N2 and the third node N3 to each other. The second node N2 is a node connected to a source of the third transistor T3, and is a node to which the first driving voltage ELVDD is supplied when the third transistor T3 is turned on in response to the emission control signal EM. The third node N3 is a node to which an anode electrode (ANE in FIG. 5) of the light emitting element LEL and a drain of the fourth transistor T4 are connected. The third node N3 is a node to which the initialization voltage VINT is supplied when the fourth transistor T4 is turned on in response to the second gate signal GI.

The second transistor T2 includes a gate connected to the first gate line GWL, a source connected to the data line DL, and a drain connected to the first node N1. The second transistor T2 is turned on in response to the first gate signal GW supplied from the first gate line GWL. The turned-on second transistor T2 supplies a data signal Vdat supplied from the data line DL to the first node N1.

The third transistor T3 includes a gate connected to the emission control line EML, a source connected to the first driving voltage line VDL to which the first driving voltage ELVDD is supplied, and a drain connected to the second node N2. The third transistor T3 is turned on in response to the emission control signal EM supplied from the emission control line EML. The turned-on third transistor T3 supplies the first driving voltage ELVDD to the second node N2.

The fourth transistor T4 includes a gate connected to the second gate line GIL, a source connected to the initialization voltage line VIL to which the initialization voltage VINT is supplied, and a drain connected to the third node N3. The fourth transistor T4 is turned on in response to the second gate signal GI supplied from the second gate line GIL. The turned-on fourth transistor T4 supplies the initialization voltage VINT to the third node N3.

The first capacitor C1 is disposed between the first node N1 and the second node N2. The first capacitor C1 serves to store the data signal Vdat input through the second transistor T2.

The light emitting element LEL may include a pixel electrode (e.g., an anode electrode ANE in FIG. 5) and a common electrode (e.g., a cathode electrode CAE in FIG. 5) facing the pixel electrode, and the common electrode may be applied with the second driving voltage ELVSS. The common electrode may be connected to the second driving voltage line VSL that transmits the second driving voltage ELVSS. The common electrode may be commonly connected to the plurality of pixels PX.

Figure 5:
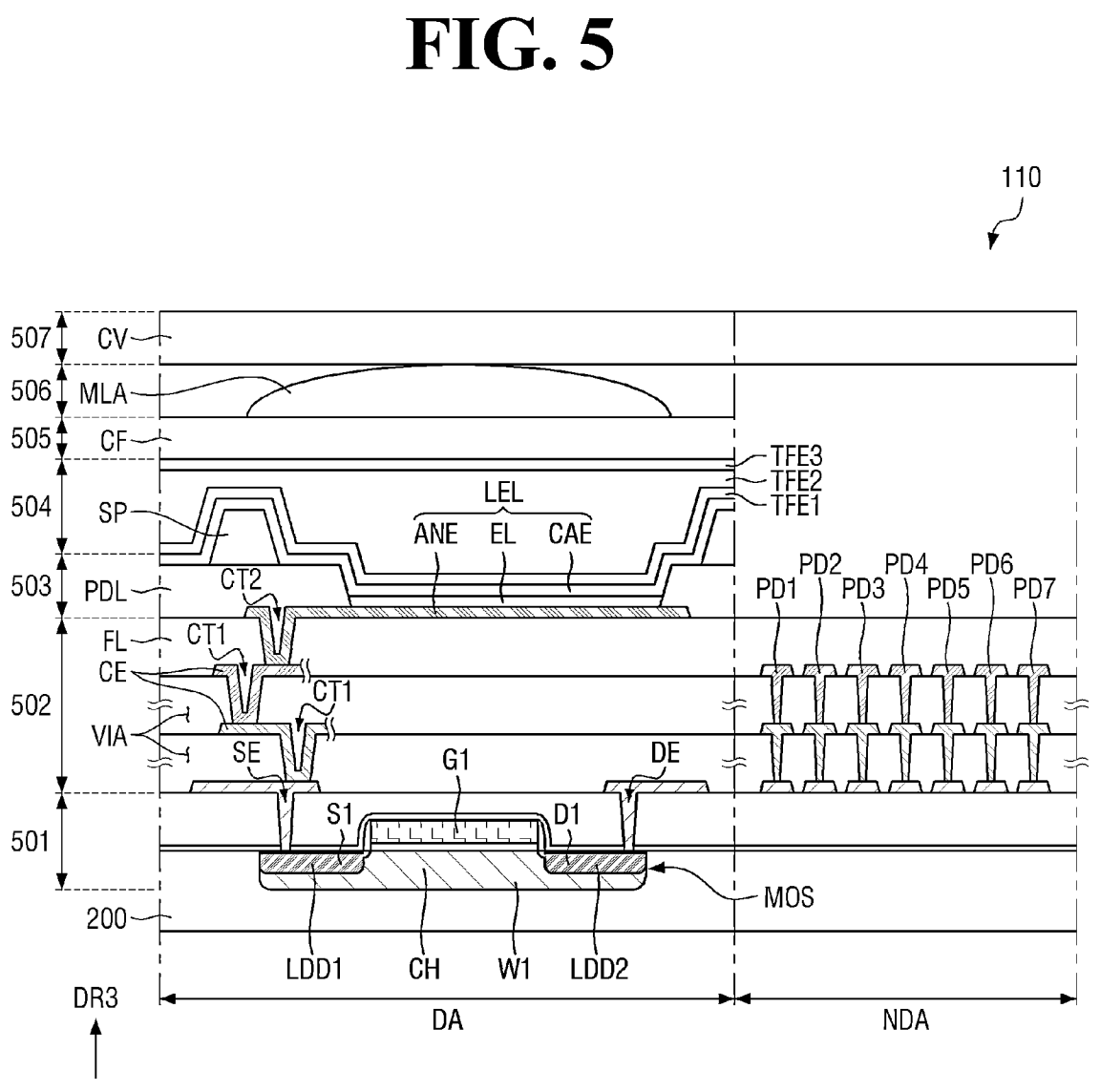

FIG. 5 is a view schematically illustrating a cross-section of a portion of the display panel of the display device according to an embodiment. Particularly, FIG. 5 is a view schematically illustrating a stacked structure of each of the non-display area and the display area of the display panel according to an embodiment.

In the description with reference to FIG. 5, the expression "on" may mean being in a third direction DR3 toward which the front surface of the semiconductor wafer substrate faces. The front surface of the semiconductor wafer substrate may refer to a direction in which light emitting elements LEL disposed in the display area emit light for displaying an image.

Referring to FIG. 5, the display panel 110 includes the semiconductor wafer substrate 200 as a base substrate. A MOSFET layer 501 including the display driving circuit 210 and the pixel driving circuit PC, at least one wiring layer 502, the light emitting element layer 503 including the light emitting element LEL, an encapsulation layer 504 covering the light emitting element LEL, a color filter layer 505 including a color filter CF, a light control layer 506 including a refractive film MLA, and a protective layer 507 including a cover glass CV may be sequentially stacked on the front surface of the semiconductor wafer substrate 200. At least some of the light emitting element layer 503, the encapsulation layer 504, the color filter layer 505, the light control layer 506, and the protective layer 507 may not be disposed in the non-display area NDA.

The semiconductor wafer substrate 200 may be a silicon substrate, a germanium substrate, or a silicon-germanium substrate. The semiconductor wafer substrate 200 may be a substrate doped with first-type impurities.

A MOSFET layer 501 including an N-type MOSFET and/or a P-type MOSFET is disposed on the semiconductor wafer substrate 200. The first type impurity may be a P-type impurity, and the second type impurity may be an N-type impurity. Alternatively, the first type impurity may be an N-type impurity, and the second type impurity may be a P-type impurity.

Herein, an N-type MOSFET (MOS) included in the MOSFET layer 501 will be described as an example. The N-type MOSFET (MOS) may include a first well region W1 doped with an N-type impurity in a substrate doped with a P-type impurity. The first well region W1 illustrated in FIG. 5 may be the first well region W1 among the first well region W1 and the second well region W2 disposed in each pixel PX.

The first well region W1 may include a first low-concentration impurity region LDD1 and a second low-concentration impurity region LDD2 having a relatively lower impurity concentration than other portions. The first low-concentration impurity region LDD1 may define a source region S1, and the second low-concentration impurity region LDD2 may define a drain region D1. A source electrode SE of the MOSFET (MOS) may be connected to the source region S1, and a drain electrode DE of the MOSFET (MOS) may be connected to the drain region D1.

A channel CH disposed to overlap the gate G1 is defined between the first low-concentration impurity region LDD1 and the second low-concentration impurity region LDD2. An oxide film, which is an insulating layer, may be disposed between the gate G1 and the first well region W1.

The MOSFETs (MOS) constitute the display driving circuit 210, and the display driving circuit 210 is disposed in the non-display area NDA of the display panel 110. In addition, the MOSFETs (MOS) constitute the transistors T1, T2, T3, and T4 included in the pixel driving circuit PC, and the pixel driving circuit PC is disposed in the display area DA of the display panel 110. That is, each pixel driving circuit PC is a circuit including a combination of MOSFETs (MOS) disposed in the MOSFET layer 501 to correspond to the display area DA. In addition, the display driving circuit 210 is a circuit including a combination of MOSFETs (MOS) disposed in the MOSFET layer 501 to correspond to the non-display area NDA. FIG. 5 exemplarily illustrates one MOSFET (MOS) of the pixel driving circuit PC disposed in the display area DA of the display panel 110 for convenience of illustration and description.

At least one wiring layer 502 is disposed on the MOSFET layer 501. At least one wiring layer 502 includes insulating layers VIA sequentially stacked on the MOSFET layer 501, and an electrode CE and a wiring (not illustrated) connected to the MOSFET (MOS) through contact holes CT1 defined through at least a portion of the insulating layers VIA.

The electrodes CE disposed in the wiring layer 502 include a first vertical connection electrode CE for connecting some of the plurality of MOSFETs (MOS) disposed in the MOSFET layer 501 corresponding to the pixel driving circuit PC and the light emitting element LEL disposed on the wiring layer 502 in a vertical direction. Here, the vertical direction refers to the normal direction or the third direction DR3 of the display panel 110.

The wirings (not illustrated) disposed in the wiring layer 502 include lines (e.g., GL, DL, and EML in FIG. 3) connected to the pixel driving circuit PC. The wirings disposed in the wiring layer 502 further include fan-out lines (not illustrated) extending from the lines (e.g., GL, DL, and EML in FIG. 3) connected to the pixel driving circuit PC and disposed in the non-display area NDA.

The wiring layer 502 may include pad electrodes PD1, PD2, PD3, PD4, PD5, PD6, and PD7 disposed to correspond to the non-display area NDA. The pad electrodes PD1, PD2, PD3, PD4, PD5, PD6, and PD7 may include a first gate pad PD1 to which the first gate line GWL is connected, a second gate pad PD2 to which the second gate line GIL is connected, an initialization pad PD3 to which the initialization line VIL is connected, a light emitting pad PD4 to which the emission control line EML is connected, a data pad PD5 to which the data line DL is connected, a first driving voltage pad PD6 to which the first driving voltage line VDL is connected, and a second driving voltage pad PD7 to which the second driving voltage line VSL is connected. However, the pad electrodes PD1, PD2, PD3, PD4, PD5, PD6, and PD7 illustrated in FIG. 5 are only examples, and the disclosure is not limited thereto.

A light emitting element layer 503 including the light emitting element LEL may be disposed on at least one wiring layer 502 including a planarization film FL. The light emitting element LEL includes an anode electrode ANE connected to the MOSFET (MOS) included in the pixel driving circuit PC through the first vertical connection electrode CE, a light emitting layer EL disposed on the anode electrode ANE, and a cathode electrode CAE disposed on the light emitting layer EL. In an embodiment, the anode electrode ANE of the light emitting element LEL may be connected to the first vertical connection electrode CE through a contact hole CT2 passing through the planarization film FL. The light emitting element layer 503 may further include a pixel defining film PDL that partitions each of the plurality of pixels PX, and a separator SP disposed on the pixel defining film PDL. The separator SP may be referred to as a partition wall or a spacer.

An encapsulation layer 504 including at least one organic encapsulation layer and at least one inorganic encapsulation layer may be disposed on the light emitting element layer 503. In an embodiment, for example, the encapsulation layer 504 may include a first encapsulation inorganic film TFE1, an encapsulation organic film TFE2, and a second encapsulation inorganic film TFE3, but the disclosure is not limited thereto.

A color filter layer 505 including a color filter CF may be disposed on the encapsulation layer 504. The color filter CF may include a red color filter that transmits red light, a green color filter that transmits green light, and a blue color filter that transmits blue light, but the disclosure is not limited thereto. The color filter layer 505 is provided when the light emitting element LEL of the light emitting element layer 503 emits white light. In an embodiment where the light emitting element LEL of the light emitting element layer 503 directly emits red light, green light, and blue light, the color filter layer 505 may be omitted.

A light control layer 506 including a refractive film MLA is disposed on the color filter layer 505. The refractive film MLA may refract incident light so that the light emitted from the light emitting element layer 503 is directed toward the normal direction or the third direction DR3 of the display panel 110. Such a refractive film MLA may also be referred to as a light control pattern.

A protective layer 507 serving as a cover layer may be disposed on the light control layer 506. The protective layer 507 may include a cover glass CV including or made of glass, but the disclosure is not limited thereto. The protective layer 507 may include, for example, a protective film.

Figure 6:
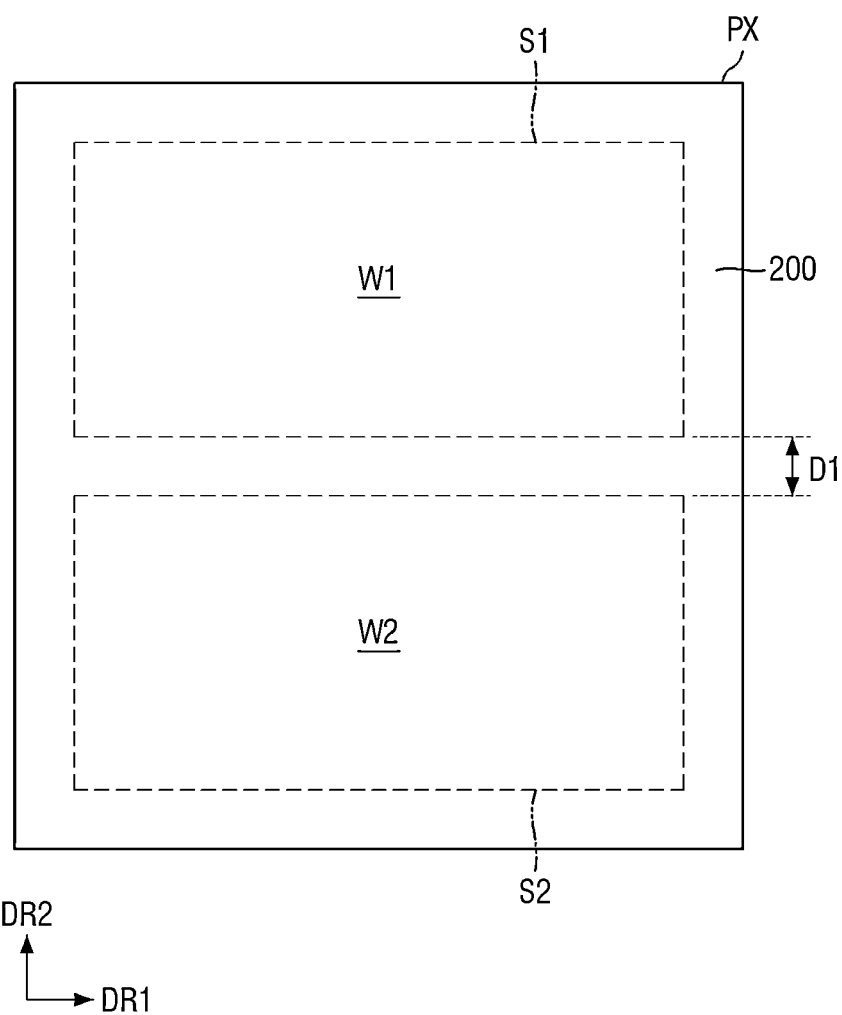
FIGS. 6 and 7 are plan views illustrating a first well region and a second well region disposed in one pixel of the display device according to an embodiment.
Figure 7:
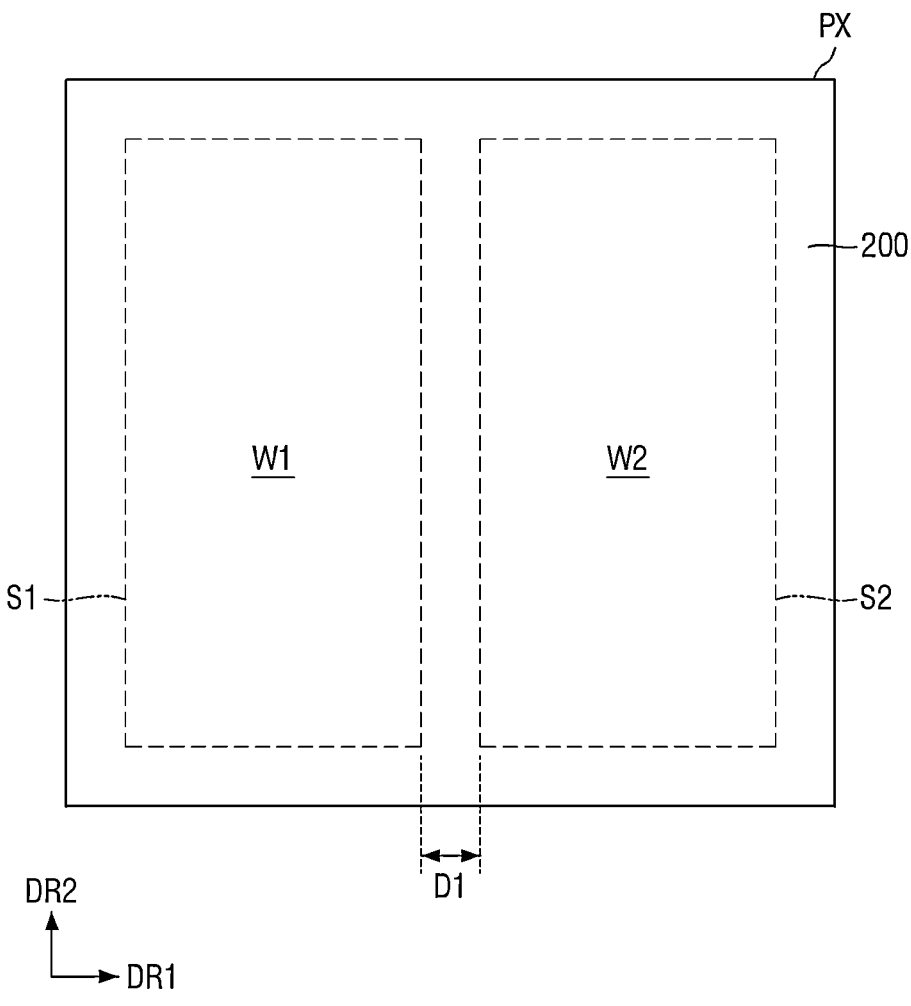

FIGS. 6 and 7 are plan views illustrating a first well region and a second well region disposed in one pixel of the display device according to an embodiment.

Referring to FIGS. 6 and 7, in an embodiment, the transistors T1, T2, T3, and T4 included in each of the plurality of pixel driving circuits PC are divided into the first transistor group TG1 connected to the first well region W1 and the second transistor group TG2 connected to the second well region W2. The first well region W1 and the second well region W2 are disposed side by side on a plane defined by the first direction DR1 and the second direction DR2 perpendicular to the first direction DR1. In one pixel PX, the first well region W1 and the second well region W2 may be disposed to be spaced apart from each other by a designated or predetermined interval, for example, a first interval D1.

In FIGS. 6 and 7, S1 denotes a first area S1, which is an area of the first well region W1, and S2 denotes a second area S2, which is an area of the second well region W2. In an embodiment, as shown in FIGS. 6 and 7, the first area S1 and second area S2 may be the same as each other, but not being limited thereto. Alternatively, the first area S1 and the second area S2 may be different from each other. In an embodiment, for example, the first area S1 may be greater than the second area S2, or the second area S2 may be greater than the first area S1.

In one pixel PX, the first well region W1 and the second well region W2 may be disposed to be adjacent to each other by the first interval D1 in the second direction DR2 as illustrated in FIG. 6. Alternatively, in one pixel PX, the first well region W1 and the second well region W2 may be disposed to be adjacent to each other by the first interval D1 in the first direction DR1 as illustrated in FIG. 7.

In one pixel PX, the first transistor group (TG1 in FIG. 4) is disposed in the first well region W1, and the second transistor group (TG2 in FIG. 4) is disposed in the second well region W2. A first body voltage is input to the first well region W1 as the body bias voltage BD1 of the first transistor group TG1. A second body voltage is input to the second well region W2 as the body bias voltages BD2, BD3, and BD4 of the second transistor group TG2. The first body voltage may be set to a voltage different from the second body voltage.

Figure 8:
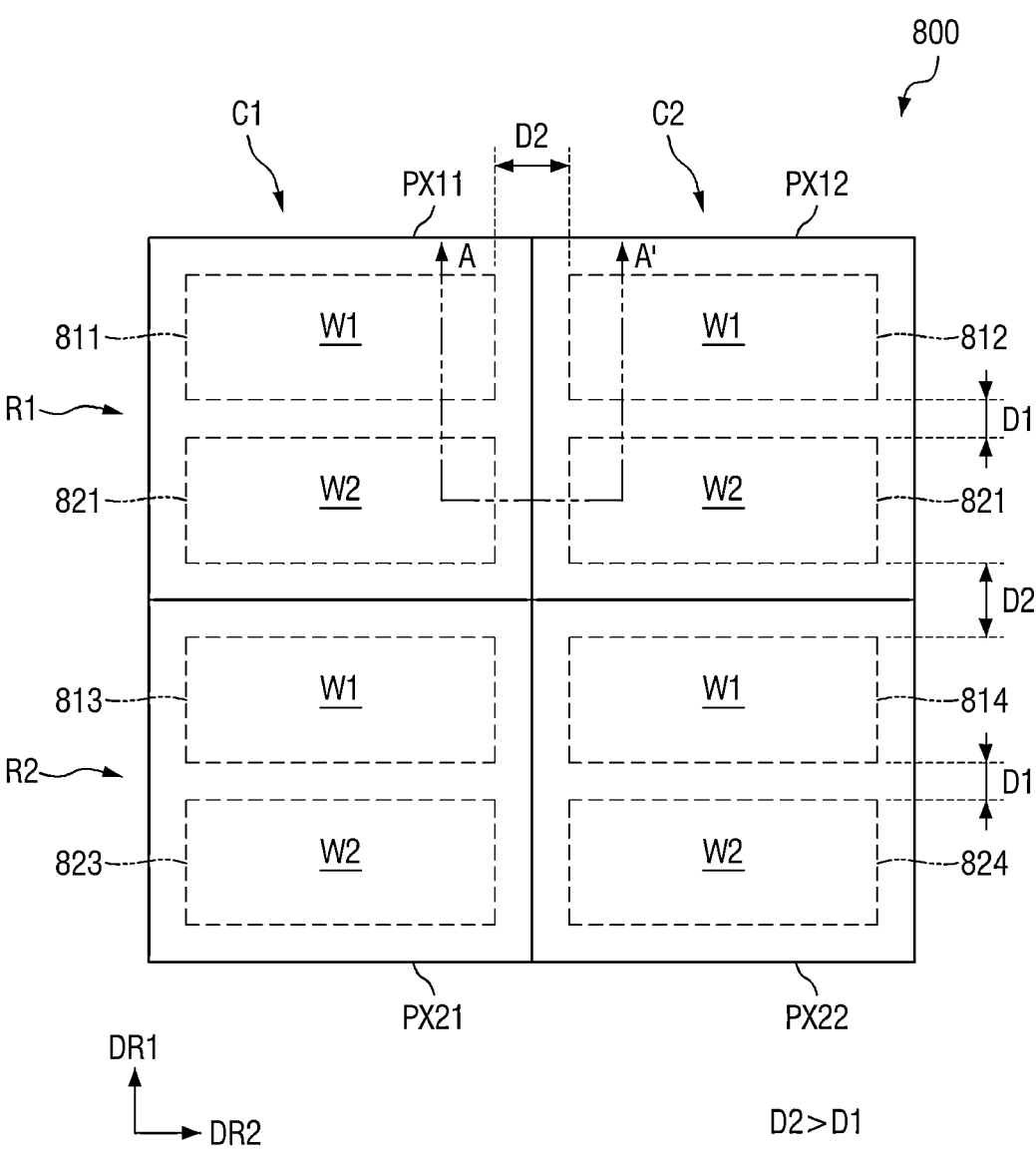
FIG. 8 is a plan view schematically illustrating a portion of a display panel according to a comparative example.
Figure 9:
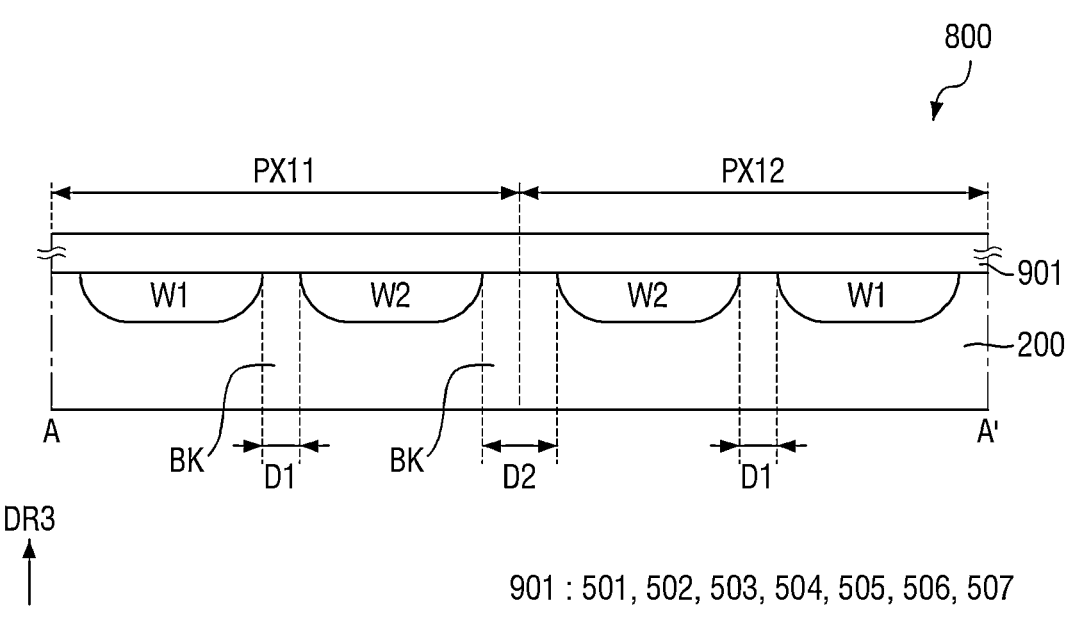
FIG. 9 is a cross-sectional view schematically illustrating a cross-section of a portion of the display panel according to the comparative example taken along line A-A' of FIG. 8.

FIG. 8 is a plan view schematically illustrating a portion of a display panel according to a comparative example. FIG. 9 is a cross-sectional view schematically illustrating a cross-section of a portion of a display panel according to the comparative example taken along line A-A' of FIG. 8.

FIG. 8 illustrates two pixels (e.g., PX11 and PX21) disposed to be adjacent to each other in the first direction DR1, and two pixels (e.g., PX11 and PX12) disposed to be adjacent to each other in the second direction DR2 therefrom.

In FIG. 8, PX11 denotes a first pixel PX11 disposed in a first row R1 and a first column C1, and a boundary of the first pixel PX11 is illustrated by a solid line.

In FIG. 8, PX21 denotes a second pixel PX21 disposed in a second row R2 and the first column C1 adjacent to the first pixel PX11, and a boundary of the second pixel PX21 is illustrated by a solid line. The first pixel PX11 and the second pixel PX21 are disposed to be adjacent to each other in the first direction DR1.

In FIG. 8, PX12 denotes a third pixel PX12 disposed in the first row R1 and a second column C2 adjacent to the first pixel PX11, and a boundary of the third pixel PX12 is illustrated by a solid line. The first pixel PX11 and the third pixel PX12 are disposed to be adjacent to each other in the second direction DR2.

In FIG. 8, PX22 denotes a fourth pixel PX22 disposed in the second row R2 and the second column C2 adjacent to the first pixel PX11, and a boundary of the fourth pixel PX22 is illustrated by a solid line. The first pixel PX11 and the fourth pixel PX22 are disposed to be adjacent to each other in a diagonal direction.

In FIG. 9, a multi-layer 901 disposed on the semiconductor wafer substrate 200 denotes a layer including the MOSFET layer 501, at least one wiring layer 502, the light emitting element layer 503, the encapsulation layer 504, the color filter layer 505, the light control layer 506, and the protective layer 507 described above with reference to FIG. 5.

Referring to FIGS. 8 and 9, in a comparative example, each of the first pixel PX11, the second pixel PX21, the third pixel PX12, and the fourth pixel PX22 includes a first well region W1 and a second well region W2. In one pixel PX, the first well region W1 and the second well region W2 are disposed to be spaced apart from each other by a first interval D1. For example, the first pixel PX11 includes the first well region W1 (811) and the second well region W2 (821) spaced apart from the first well region W1 (811) by the first interval D1 in the first direction DR1. The second pixel PX21 includes the first well region W1 (813) and the second well region W2 (823) spaced apart from the first well region W1 (813) by the first interval D1 in the first direction DR1. The third pixel PX12 includes the first well region W1 (812) and the second well region W2 (822) spaced apart from the first well region W1 (812) by the first interval D1 in the first direction DR1. The fourth pixel PX22 includes the first well region W1 (814) and the second well region W2 (824) spaced apart from the first well region W1 (814) by the first interval D1 in the first direction DR1.

In the comparative example, an interval between the well regions between two pixels (e.g., PX11 and PX21) disposed to be adjacent to each other may have a second interval D2 greater than the first interval D1. For example, the second well region W2 (821) of the first pixel PX11 and the first well region W1 (813) of the second pixel PX21 may be disposed to be spaced apart from each other by the second interval D2 in the first direction DR1. Alternatively, the first well region W1 (811) (or the second well region W2 (821)) of the first pixel PX11 and the first well region W1 (812) (or the second well region W2 (822)) of the third pixel PX12 may be disposed to be spaced apart from each other by the second interval D2 in the second direction DR2.

In the comparative example, a wide interval between the well regions between the two pixels (e.g., PX11 and PX21) disposed to be adjacent to each other may be a factor in lowering the degree of integration of the pixels PX.

On the other hand, according to an embodiment of the disclosure, display specifications of about 4000 pixels per inch (PPI) or higher may be met by increasing the degree of integration of the pixels PX as will be described later with reference to FIGS. 10 to 13.

Figure 10:
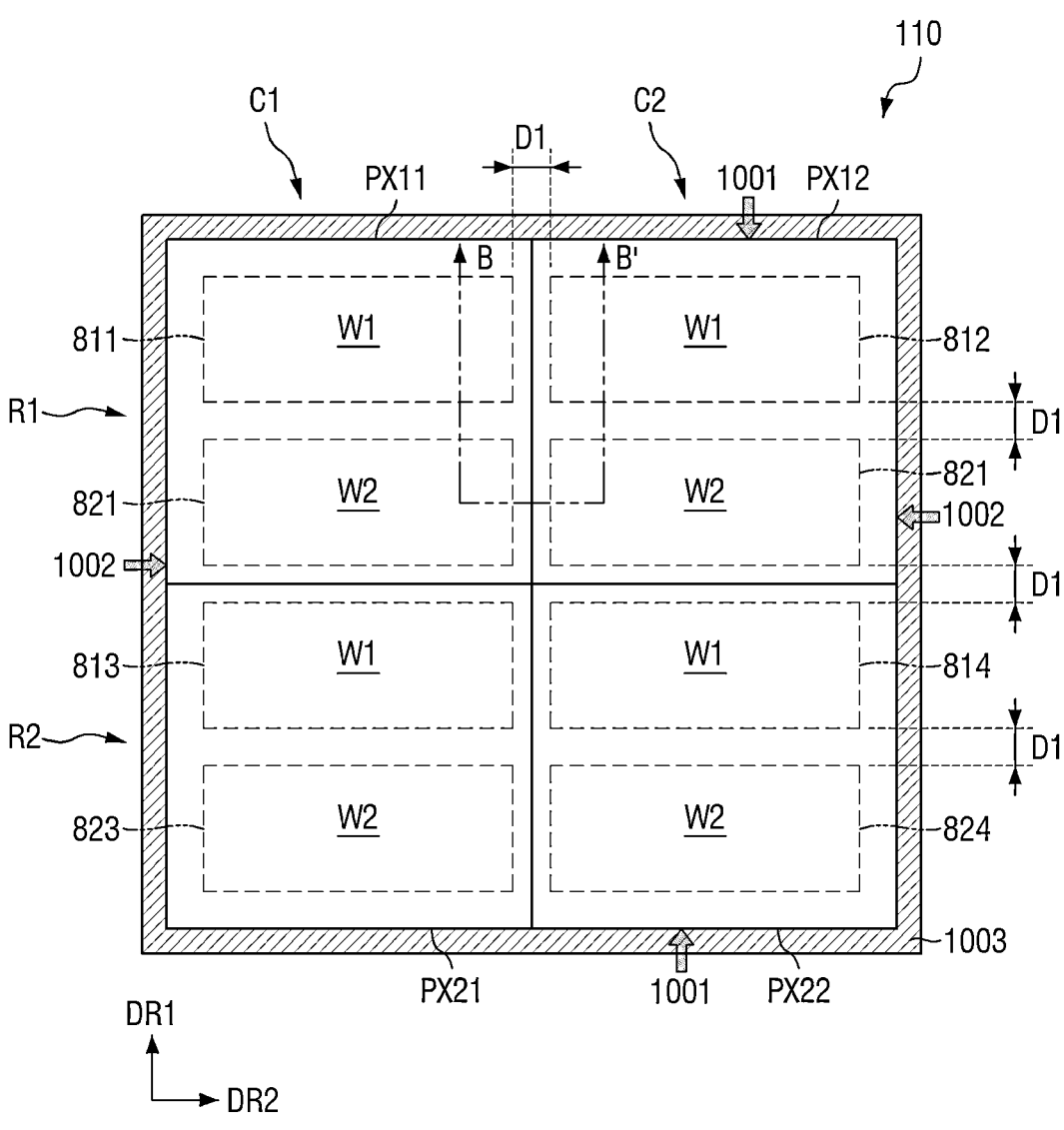
FIG. 10 is a plan view schematically illustrating a portion of the display panel according to an embodiment.
Figure 11:
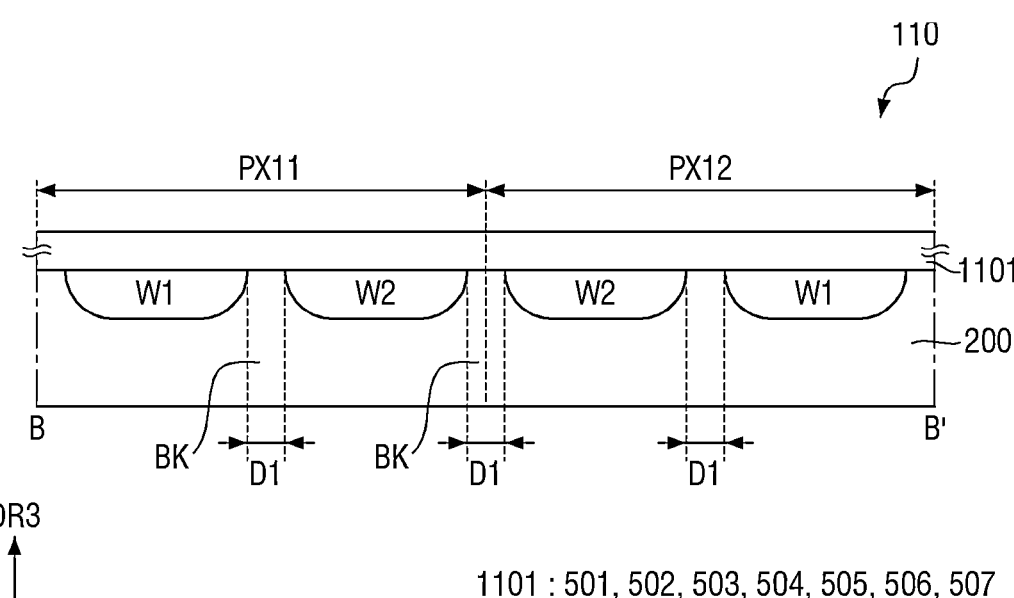
FIG. 11 is a cross-sectional view schematically illustrating a cross-section of a portion of the display panel according to an embodiment taken along line B-B' of FIG. 10.

FIG. 10 is a plan view schematically illustrating a portion of the display panel according to an embodiment. FIG. 11 is a cross-sectional view schematically illustrating a cross-section of a portion of the display panel according to an embodiment taken along line B-B' of FIG. 10.

FIG. 10 illustrates two pixels (e.g., PX11 and PX21) disposed to be adjacent to each other in the first direction DR1, and two pixels (e.g., PX11 and PX12) disposed to be adjacent to each other in the second direction DR2 therefrom.

In FIG. 10, PX11 denotes a first pixel PX11 disposed in a first row R1 and a first column C1, and a boundary of the first pixel PX11 is illustrated by a solid line.

In FIG. 10, PX21 denotes a second pixel PX21 disposed in a second row R2 and the first column C1 adjacent to the first pixel PX11, and a boundary of the second pixel PX21 is illustrated by a solid line. The first pixel PX11 and the second pixel PX21 are disposed to be adjacent to each other in the first direction DR1.

In FIG. 10, PX12 denotes a third pixel PX12 disposed in the first row R1 and a second column C2 adjacent to the first pixel PX11, and a boundary of the third pixel PX12 is illustrated by a solid line. The first pixel PX11 and the third pixel PX12 are disposed to be adjacent to each other in the second direction DR2.

In FIG. 10, PX22 denotes a fourth pixel PX22 disposed in the second row R2 and the second column C2 adjacent to the first pixel PX11, and a boundary of the fourth pixel PX22 is illustrated by a solid line. The first pixel PX11 and the fourth pixel PX22 are disposed to be adjacent to each other in a diagonal direction.

In FIG. 11, a multi-layer 1101 disposed on the semiconductor wafer substrate 200 denotes a layer including the MOSFET layer 501, at least one wiring layer 502, the light emitting element layer 503, the encapsulation layer 504, the color filter layer 505, the light control layer 506, and the protective layer 507 described with reference to FIG. 5.

Referring to FIGS. 10 and 11, in an embodiment of the disclosure, each of the first pixel PX11, the second pixel PX21, the third pixel PX12, and the fourth pixel PX22 includes a first well region W1 and a second well region W2. In one pixel PX, the first well region W1 and the second well region W2 are disposed to be spaced apart from each other by a first interval D1. For example, the first pixel PX11 includes the first well region W1 (811) and the second well region W2 (821) spaced apart from the first well region W1 (811) by the first interval D1 in the first direction DR1. The second pixel PX21 includes the first well region W1 (813) and the second well region W2 (823) spaced apart from the first well region W1 by the first interval D1 in the first direction DR1. The third pixel PX12 includes the first well region W1 (812) and the second well region W2 (822) spaced apart from the first well region W1 (812) by the first interval D1 in the first direction DR1. The fourth pixel PX22 includes the first well region W1 (814) and the second well region W2 (824) spaced apart from the first well region W1 (814) by the first interval D1 in the first direction DR1.

According to an embodiment, an interval between the well regions between two pixels (e.g., PX11 and PX21) disposed to be adjacent to each other may have a first interval D1. For example, the second well region W2 (821) of the first pixel PX11 and the first well region W1 (813) of the second pixel PX21 may be disposed to be spaced apart from each other by the first interval D1 in the first direction DR1. Accordingly, as indicated by an arrow 1001 in FIG. 10, the interval between the well regions between the two pixels (e.g., PX11 and PX21) disposed to be adjacent to each other in the first direction DR1 is narrower compared to the comparative example described with reference to FIGS. 8 and 9. In addition, the first well region W1 (811) (or the second well region W2 (821)) of the first pixel PX11 and the first well region W1 (812) (or the second well region W2 (822)) of the third pixel PX12 may be disposed to be spaced apart from each other by the first interval D1 in the second direction DR2. Accordingly, as indicated by an arrow 1002 in FIG. 10, the interval between the well regions between the two pixels (e.g., PX11 and PX12) disposed to be adjacent to each other in the second direction DR2 is narrower compared to the comparative example described with reference to FIGS. 8 and 9.

In FIG. 10, an area hatched in an oblique pattern as illustrated by reference numeral 1003 denotes a difference between an area used (or occupied) to dispose the 2×2 pixels PX according to an embodiment and an area used to dispose the 2×2 pixels PX according to the comparative example. According to an embodiment of the disclosure, in disposing the pixels PX of 2×2, a smaller space is used as much as the area hatched in the oblique pattern as illustrated by reference numeral 1003. Therefore, according to an embodiment of the disclosure, compared to the comparative example, the degree of integration of disposing the pixels PX may be increased by the area hatched in the oblique pattern as illustrated by reference numeral 1003.

Figure 12:
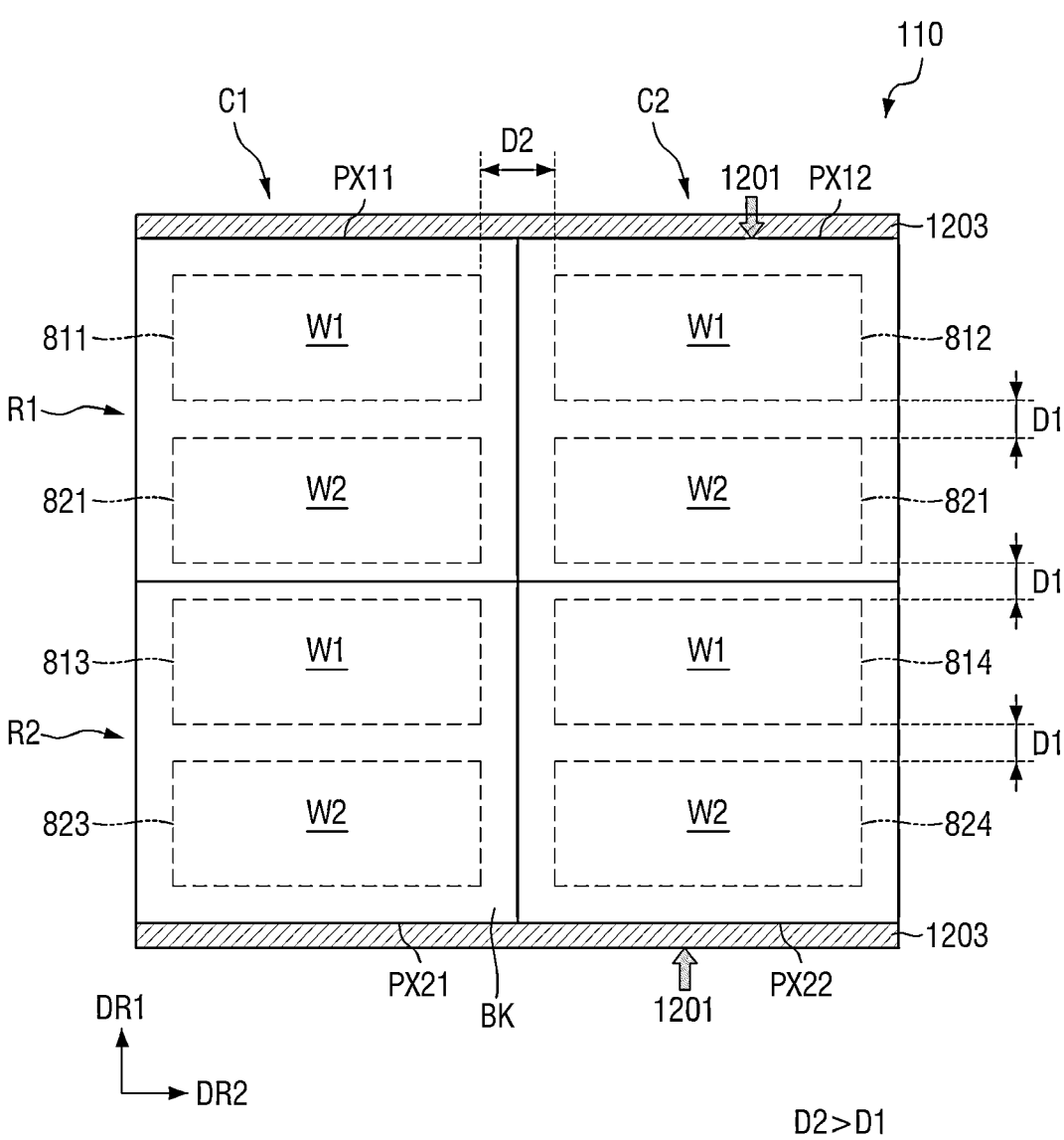
FIG. 12 is a plan view schematically illustrating a display panel according to an embodiment in which an interval between well regions between two pixels adjacent in a first direction is adjusted.

FIG. 12 is a plan view schematically illustrating a display panel according to an embodiment in which an interval between well regions between two pixels adjacent in a first direction is adjusted.

An embodiment of FIG. 12 may be at least partially similar to the embodiment of FIG. 10. Hereinafter, for convenience of description, only features of the embodiment of FIG. 12 that are different from those of the embodiment of FIG. 10 will be described. Accordingly, features that are not described with reference to FIG. 12 may be the same as those of the embodiment of FIG. 10.

In an embodiment, as shown in FIG. 12, the interval between the well regions between two pixels PX adjacent to each other is adjusted only in the first direction DR1.

Referring to FIG. 12, the interval between the well regions of the two pixels PX disposed to be adjacent to each other may have a first interval D1 in the first direction DR1 and a second interval D2 in the second direction DR2. For example, the second well region W2 (821) of the first pixel PX11 and the first well region W1 (813) of the second pixel PX21 may be disposed to be spaced apart from each other by the first interval D1 in the first direction DR1. Accordingly, as indicated by an arrow 1201 in FIG. 12, the interval between the well regions between the two pixels (e.g., PX11 and PX21) disposed to be adjacent to each other in the first direction DR1 is narrower compared to the comparative example described with reference to FIGS. 8 and 9.

In such an embodiment, the first well region W1 (811) (or the second well region W2 (821)) of the first pixel PX11 and the first well region W1 (812) (or the second well region W2 (822)) of the third pixel PX12 may be disposed to be spaced apart from each other by the second interval D2 greater than the first interval D1 in the second direction DR2. Accordingly, the interval between the well regions between the two pixels (e.g., PX11 and PX12) disposed to be adjacent to each other in the second direction DR2 may not be different compared to the comparative example described with reference to FIGS. 8 and 9.

In FIG. 12, an area hatched in an oblique pattern as illustrated by reference numeral 1203 denotes a difference between an area used to dispose the 2×2 pixels PX according to an embodiment and an area used to dispose the 2×2 pixels PX according to the comparative example. According to an embodiment of the disclosure, in disposing the pixels PX of 2×2, a smaller space is used as much as the area hatched in the oblique pattern as illustrated by reference numeral 1203. Therefore, according to an embodiment of the disclosure, compared to the comparative example, the degree of integration of disposing the pixels PX may be increased by the area hatched in the oblique pattern as illustrated by reference numeral 1203.

Figure 13:
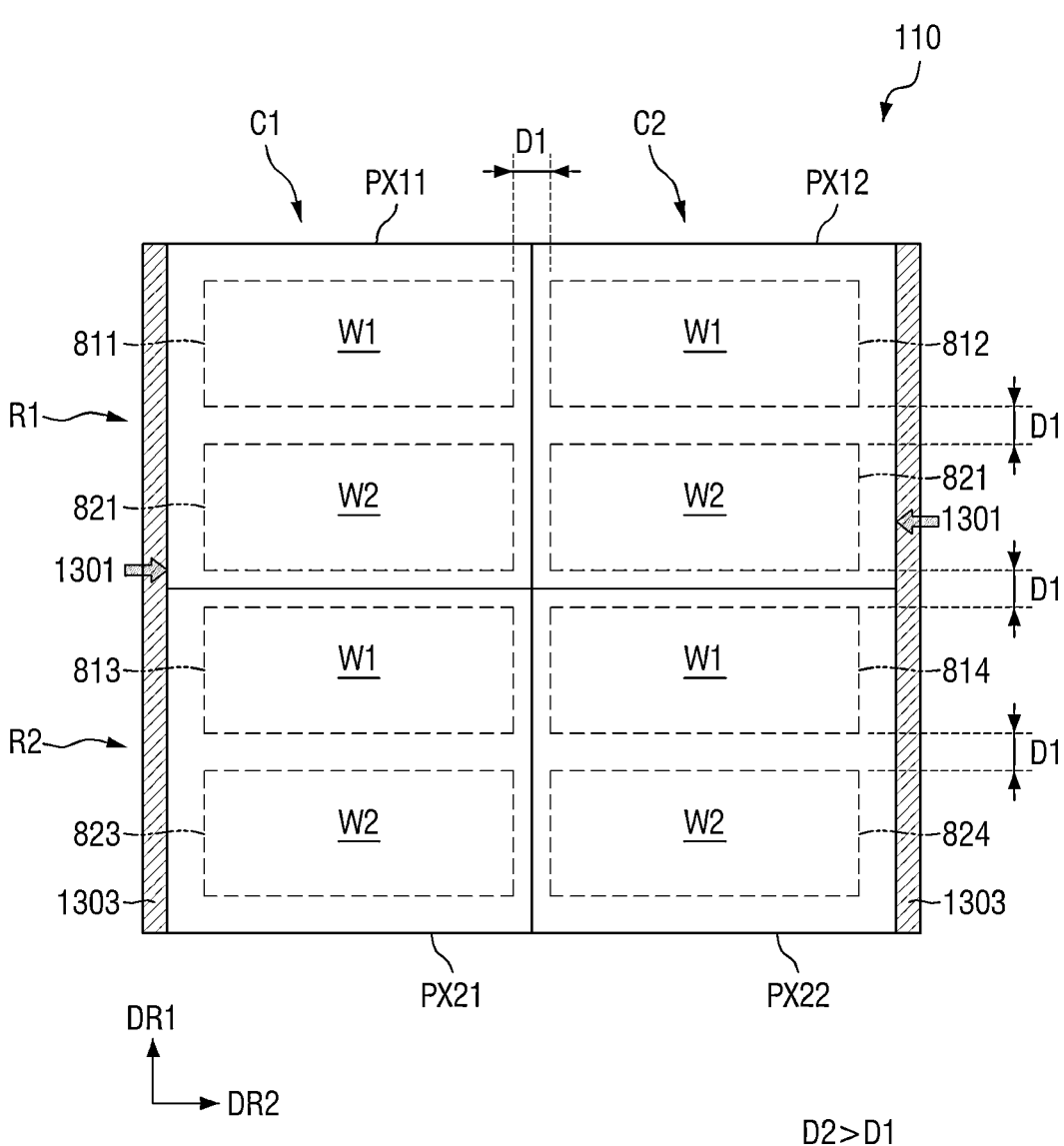
FIG. 13 is a plan view schematically illustrating a display panel according to an embodiment in which an interval between well regions between two pixels adjacent in a second direction is adjusted.

FIG. 13 is a plan view schematically illustrating a display panel according to an embodiment in which an interval between well regions between two pixels adjacent in a second direction is adjusted.

An embodiment of FIG. 13 may be at least partially similar to the embodiment of FIG. 10. Hereinafter, for convenience of description, only features of the embodiment of FIG. 13 that are different from those of the embodiment of FIG. 10 will be described. Accordingly, features that are not described with reference to FIG. 13 may be of the same as those the embodiment of FIG. 10.

In an embodiment, as shown in 13, the interval between the well regions between two pixels PX adjacent to each other is adjusted only in the second direction DR2.

Referring to FIG. 13, the interval between the well regions of the two pixels PX disposed to be adjacent to each other may have a second interval D2 in the first direction DR1 and a first interval D1 in the second direction DR2. For example, the second well region W2 (821) of the first pixel PX11 and the first well region W1 (813) of the second pixel PX21 may be disposed to be spaced apart from each other by the second interval D2 in the first direction DR1. Accordingly, the interval between the well regions between the two pixels (e.g., PX11 and PX21) disposed to be adjacent to each other in the first direction DR1 may not be different compared to the comparative example described with reference to FIGS. 8 and 9.

In such an embodiment, the first well region W1 (811) (or the second well region W2 (821)) of the first pixel PX11 and the first well region W1 (812) (or the second well region W2 (822)) of the third pixel PX12 may be disposed to be spaced apart from each other by the first interval D1 smaller than the second interval D2 in the second direction DR2. Accordingly, as indicated by an arrow 1301 in FIG. 13, the interval between the well regions between the two pixels (e.g., PX11 and PX12) disposed to be adjacent to each other in the second direction DR2 is narrower compared to the comparative example described with reference to FIGS. 8 and 9.

In FIG. 13, an area hatched in an oblique pattern as illustrated by reference numeral 1303 denotes a difference between an area used to dispose the 2×2 pixels PX according to an embodiment and an area used to dispose the 2×2 pixels PX according to the comparative example. According to an embodiment of the disclosure, in disposing the pixels PX of 2×2, a smaller space is used as much as the area hatched in the oblique pattern as illustrated by reference numeral 1303. Therefore, according to an embodiment of the disclosure, compared to the comparative example, the degree of integration of disposing the pixels PX may be increased by the area hatched in the oblique pattern as illustrated by reference numeral 1303.

Figure 14:
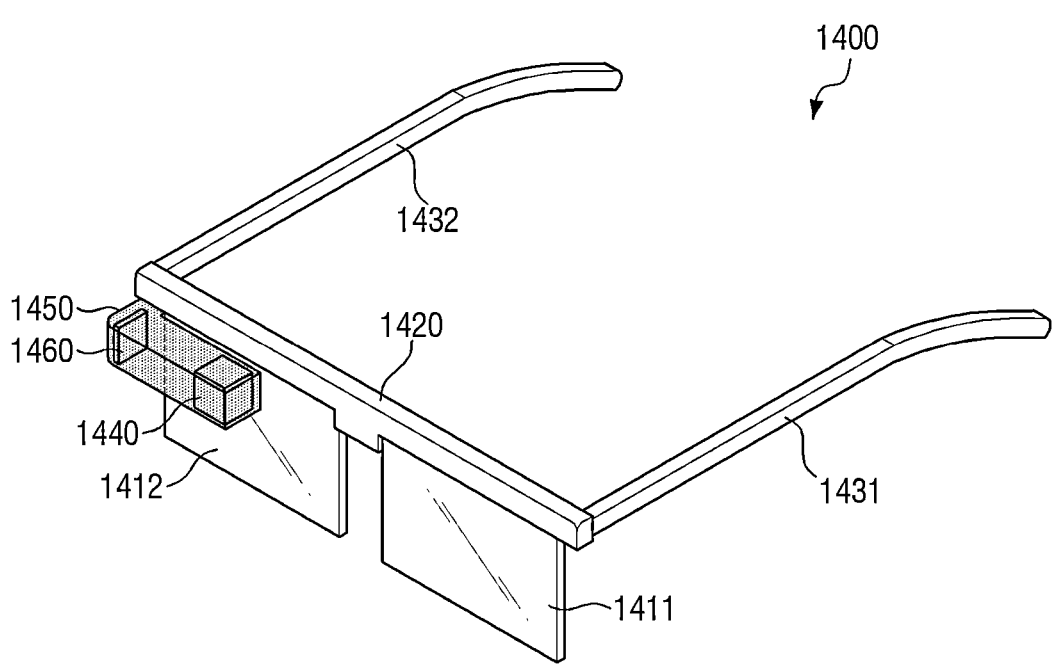
FIG. 14 is a view illustrating a virtual reality device including the display device according to an embodiment.

FIG. 14 is a view illustrating a virtual reality device including the display device according to an embodiment.

The display device 10 according to an embodiment may be a display device 10 included in a mobile electronic device. The display device 10 according to an embodiment may be included in a wearable device that is developed in the form of glasses or a helmet and focused at a distance close to the user's eyes. For example, the wearable device may be a head mounted display (HMD) device or AR glass. Such a wearable device provides a user with an augmented reality (AR) screen or a virtual reality (VR) screen.

An embodiment of a virtual reality device 1400, to which a display device 1460 according to an embodiment is applied, is illustrated in FIG. 14. Here, the display device 1460 may be, for example, a display device 1460 including the components of FIGS. 1 to 13 described above.

Referring to FIG. 14, the virtual reality device 1400 according to an embodiment may be AR glasses in the form of glasses. The virtual reality device 1400 according to an embodiment may include the display device 1460, a left eye lens 1411, a right eye lens 1412, a support frame 1420, eyeglass frame legs 1431 and 1432, a reflective member 1440, and an accommodating portion 1450.

In FIG. 14, the virtual reality device 1400 in the form of AR glass is shown as an example, but the virtual reality device 1400 according to an embodiment may also be applied to an HMD. That is, the virtual reality device 1400 according to an embodiment is not limited to that illustrated in FIG. 11, and may be applied in various forms in various other mobile electronic devices.

The accommodating portion 1450 may include the display device 1460 and the reflective member 1440. An image displayed on the display device 1460 may be reflected by the reflective member 1440 and provided to a user's right eye through the right eye lens 1412. Accordingly, the user may view a virtual reality image displayed on the display device 1460 through the right eye.

In an embodiment, as shown in FIG. 14, the accommodating portion 1450 may be disposed at a right distal end of the support frame 1420, but an embodiment of the disclosure is not limited thereto. For example, the accommodating portion 1450 may be disposed at a left distal end of the support frame 1420. In this case, an image displayed on the display device 1460 may be reflected by the reflective member 1440 and provided to a user's left eye through the left eye lens 1411. Accordingly, the user may view a virtual reality image displayed on the display device 1460 through the left eye. Alternatively, the accommodating portions 1450 may be disposed at both the left and right distal ends of the support frame 1420. In this case, the user may view a virtual reality image displayed on the display device 1460 through both the left and right eyes.

Figure 15:
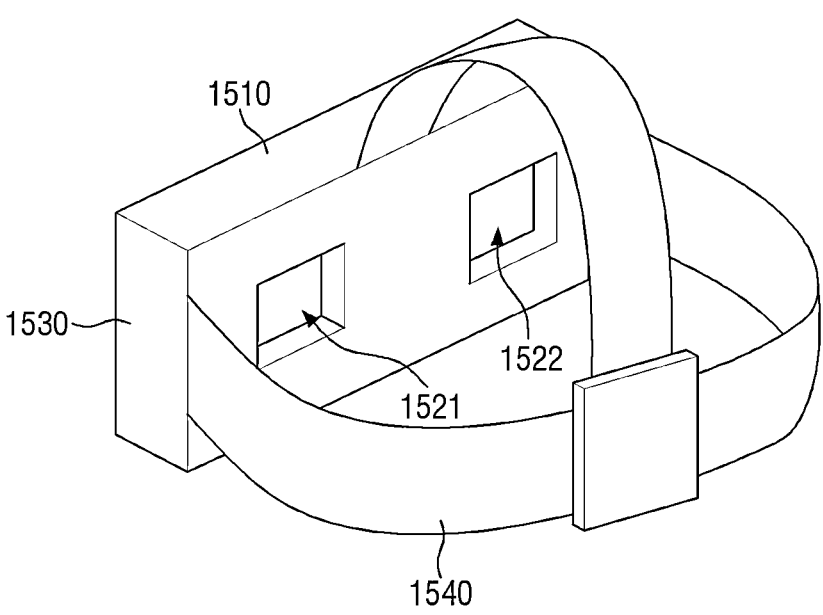
FIGS. 15 and 16 are views illustrating an HMD device to which the display device according to an embodiment is applied.
Figure 16:
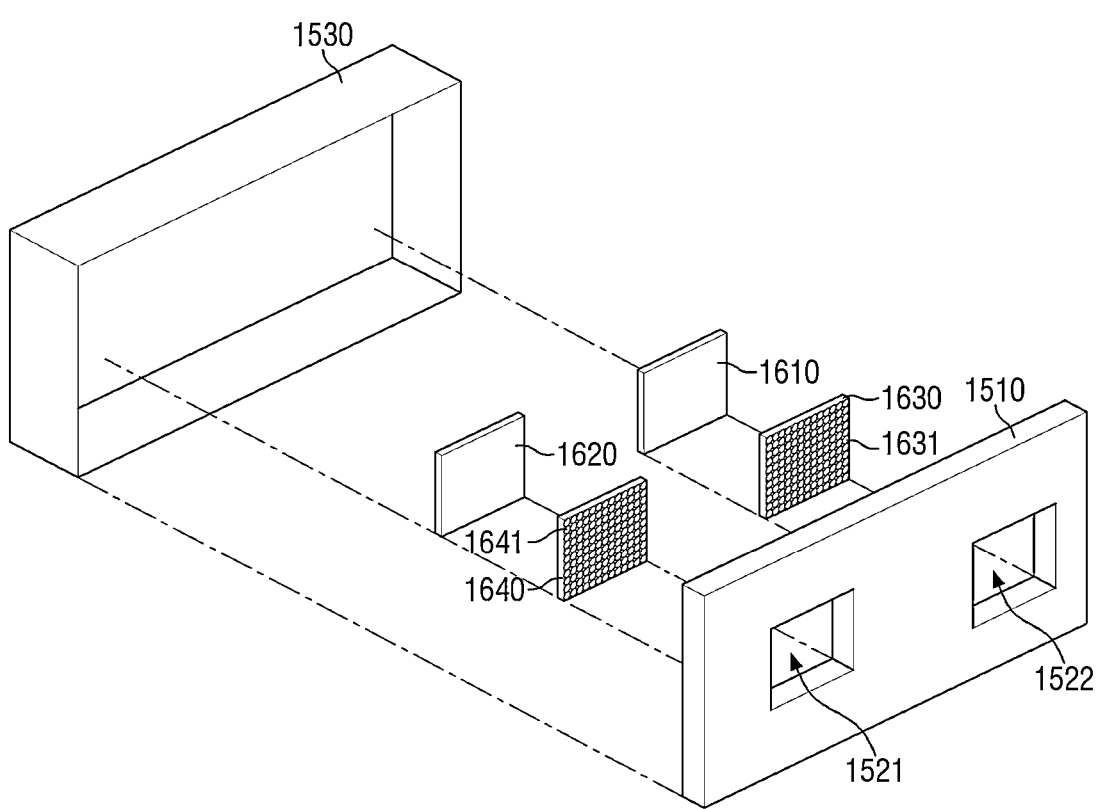

FIGS. 15 and 16 are views illustrating an HMD device to which the display device according to an embodiment is applied.

Referring to FIGS. 15 and 16, the display device 10 according to an embodiment may be applied to an HMD device. The HMD device includes a first display device 1610 and a second display device 1620, each of which may be the display device 10 according to an embodiment. The first display device 1610 provides an image to the user's right eye, and the second display device 1620 provides an image to the user's left eye.

A first lens array 1630 may be disposed between the first display device 1610 and an accommodating portion cover 1510. The first lens array 1630 may include a plurality of lenses 1631. The plurality of lenses 1631 may be formed as convex lenses that are convex in a direction toward the accommodating portion cover 1510.

A second lens array 1640 may be disposed between the second display device 1620 and the accommodating portion cover 1510. The second lens array 1640 may include a plurality of lenses 1641. The plurality of lenses 1641 may be formed as convex lenses that are convex in a direction toward the accommodating portion cover 1510.

The accommodating portion 1530 serves to accommodate the first display device 1610, the second display device 1620, the first lens array 1630, and the second lens array 1640. In an embodiment, one surface of the accommodating portion 1530 may be opened to accommodate the first display device 1610, the second display device 1620, the first lens array 1630, and the second lens array 1640.

The accommodating portion cover 1510 is disposed to cover the opened surface of the accommodating portion 1530. The accommodating portion cover 1510 may include a first opening 1521 where the user's right eye is disposed and a second opening 1522 where the user's left eye is disposed. In an embodiment, as shown in FIGS. 15 and 16, the first opening 1521 and the second opening 1522 may be defined or formed in a quadrangular shape, but the disclosure is not limited thereto. The first opening 1521 and the second opening 1522 may be defined or formed in a circular shape or an elliptical shape. Alternatively, the first opening 1521 and the second opening 1522 may be combined to form one opening.

The first opening 1521 may be aligned with the first display device 1610 and the first lens array 1630, and the second opening 1522 may be aligned with the second display device 1620 and the second lens array 1640. Therefore, the user may view the image of the first display device 1610 magnified as a virtual image by the first lens array 1630 through the first opening 1521, and may view the image of the second display device 1620 magnified as a virtual image by the second lens array 1640 through the second opening 1522.

A head mounting band 1540 serves to fix the accommodating portion 1530 to a user's head so that the first opening 1521 and the second opening 1522 of the accommodating portion cover 1510 are disposed on the user's right and left eyes, respectively. The head mounting band 1540 may be connected to upper, left side, and right side surfaces of the accommodating portion 1530.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the claims.

What is claimed is:

1. A display device comprising:
a substrate;
a driving element layer disposed on the substrate and including a plurality of pixel driving circuits for driving a plurality of pixels; and
a light emitting element layer disposed on the driving element layer and including a light emitting element of each of the plurality of pixels,
wherein transistors included in each of the plurality of pixel driving circuits are divided into a first transistor group connected to a first well region of the substrate and a second transistor group connected to a second well region of the substrate,
the first well region and the second well region in each of the plurality of pixels are defined in a same surface portion of the substrate,
the first well region and the second well region in each of the plurality of pixels are spaced apart from each other by a first interval when viewed in a thickness direction of the substrate,
the plurality of pixels includes a first pixel and a second pixel adjacent to each other in a first direction, and
well regions adjacent to each other in the first pixel and the second pixel are spaced apart from each other by the first interval when viewed in the thickness direction of the substrate,
wherein the first pixel is adjacent to the second pixel in the first direction, and
wherein the first well region included in the first pixel is spaced apart from the first well region or the second well region of the second pixel by a second interval which is greater than the first interval.

2. The display device of claim 1, wherein
a first body voltage is input to the first well region as a body bias voltage of the first transistor group, and
a second body voltage is input to the second well region as a body bias voltage of the second transistor group.

3. The display device of claim 2, wherein the first well region and the second well region in each of the plurality of pixels are spaced apart from each other by the first interval in the first direction.

4. The display device of claim 3, wherein the first well region included in the first pixel is spaced apart from the first well region or the second well region included in the second pixel by the first interval in the first direction.

5. The display device of claim 4, wherein
the plurality of pixels further includes a third pixel adjacent to the first pixel in a second direction perpendicular to the first direction, and
the first well region included in the first pixel is spaced apart from the first well region or the second well region included in the third pixel by the second interval.

6. The display device of claim 4, wherein
the plurality of pixels further includes a third pixel adjacent to the first pixel in a second direction perpendicular to the first direction, and
the first well region included in the first pixel is spaced apart from the first well region or the second well region included in the third pixel by the first interval in the second direction.

7. The display device of claim 6, wherein
the first direction is a short side direction of the display device, and
the second direction is a long side direction of the display device.

8. The display device of claim 6, wherein
the first direction is a long side direction of the display device, and
the second direction is a short side direction of the display device.

9. The display device of claim 1, wherein
the first transistor group includes a driving transistor which supplies a driving current to the light emitting element, and
the second transistor group includes at least one switching transistor which controls a voltage of a node included in the pixel driving circuit.

10. The display device of claim 1, wherein the transistors included in each of the plurality of pixel driving circuits are P-type metal oxide semiconductor field effect transistors or N-type metal oxide semiconductor field effect transistors.

11. A mobile electronic device comprising:
a display device including a display panel in which a light emitting element is disposed on a substrate,
wherein the display panel includes:
a driving element layer disposed on the substrate and including a plurality of pixel driving circuits for driving a plurality of pixels; and
a light emitting element layer disposed on the driving element layer and including the light emitting element of each of the plurality of pixels,
wherein transistors included in each of the plurality of pixel driving circuits are divided into a first transistor group connected to a first well region of the substrate and a second transistor group connected to a second well region of the substrate,
the first well region and the second well region in each of the plurality of pixels are defined in a same surface portion of the substrate,
the first well region and the second well region in each of the plurality of pixels are spaced apart from each other by a first interval when viewed in a thickness direction of the substrate,
the plurality of pixels include a first pixel and a second pixel adjacent to each other in a first direction, and well regions adjacent to each other in the first pixel and the second pixel are spaced apart from each other by the first interval when viewed in the thickness direction of the substrate, wherein the first pixel is adjacent to the second pixel in the first direction, and wherein the first well region included in the first pixel is spaced apart from the first well region or the second well region of the second pixel by a second interval which is greater than the first interval.

12. The mobile electronic device of claim 11, wherein a first body voltage is input to the first well region as a body bias voltage of the first transistor group, and a second body voltage is input to the second well region as a body bias voltage of the second transistor group.

13. The mobile electronic device of claim 12, wherein the first well region and the second well region in each of the plurality of pixels are spaced apart from each other by the first interval in the first direction.

14. The mobile electronic device of claim 13, wherein the first well region included in the first pixel is spaced apart from the first well region or the second well region included in the second pixel by the first interval in the first direction.

15. The mobile electronic device of claim 14, wherein the plurality of pixels further includes a third pixel adjacent to the first pixel in a second direction perpendicular to the first direction, and the first well region included in the first pixel is spaced apart from the first well region or the second well region included in the third pixel by the second interval.

16. The mobile electronic device of claim 14, wherein the plurality of pixels further includes a third pixel adjacent to the first pixel in a second direction perpendicular to the first direction, and the first well region included in the first pixel is spaced apart from the first well region or the second well region included in the third pixel by the first interval in the second direction.

17. The mobile electronic device of claim 16, wherein the first direction is a short side direction of the display device, and the second direction is a long side direction of the display device.

18. The mobile electronic device of claim 16, wherein the first direction is a long side direction of the display device, and the second direction is a short side direction of the display device.

19. The mobile electronic device of claim 11, wherein the first transistor group includes a driving transistor which supplies a driving current to the light emitting element, and the second transistor group includes at least one switching transistor which controls a voltage of a node included in the pixel driving circuit.

20. The mobile electronic device of claim 11, wherein the transistors included in each of the plurality of pixel driving circuits are P-type metal oxide semiconductor field effect transistors or N-type metal oxide semiconductor field effect transistors.

* * * * *